United States Patent
Vattikonda et al.

(10) Patent No.: US 9,941,866 B2
(45) Date of Patent: Apr. 10, 2018

(54) APPARATUS FOR DESIGN FOR TESTABILITY OF MULTIPORT REGISTER ARRAYS

(71) Applicant: QUALCOMM Incorporated, San Diego, CA (US)

(72) Inventors: Rakesh Vattikonda, San Diego, CA (US); Samrat Sinharoy, San Diego, CA (US); De Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 163 days.

(21) Appl. No.: 15/207,800

(22) Filed: Jul. 12, 2016

(65) Prior Publication Data

US 2018/0019734 A1    Jan. 18, 2018

(51) Int. Cl.
| | |
|---|---|
| H03K 3/289 | (2006.01) |
| H03K 3/037 | (2006.01) |
| G01R 31/317 | (2006.01) |
| G01R 31/3185 | (2006.01) |

(52) U.S. Cl.
CPC ..... *H03K 3/0372* (2013.01); *G01R 31/31704* (2013.01); *G01R 31/31723* (2013.01); *G01R 31/318541* (2013.01)

(58) Field of Classification Search
CPC ............ H03K 3/0372; G01R 31/31704; G01R 31/31723; G01R 31/318541
USPC ................ 327/202, 203, 198–201, 204–226; 714/727, 731, 30, 702
See application file for complete search history.

(56) References Cited

U.S. PATENT DOCUMENTS

| | | |
|---|---|---|
| 5,671,377 A | 9/1997 | Bleidt et al. |
| 5,783,958 A * | 7/1998 | Lysinger ............. H03K 3/0372 327/202 |
| 7,535,772 B1 * | 5/2009 | Parameswaran ..... G11C 7/1051 365/189.02 |
| 8,214,697 B2 | 7/2012 | Pu et al. |
| 8,954,803 B2 | 2/2015 | Chopra |

(Continued)

FOREIGN PATENT DOCUMENTS

JP    S59218548 A    12/1984

OTHER PUBLICATIONS

International Search Report and Written Opinion—PCT/US2017/038347—ISA/EPO—Sep. 14, 2017.

*Primary Examiner* — Thomas Skibinski
(74) *Attorney, Agent, or Firm* — Arent Fox, LLP and Qualcomm, LLP (57) ABSTRACT

In an aspect of the disclosure, a method and an apparatus are provided. The apparatus is a register array including first and second flip-flop latch arrays. The first flip-flop latch array includes a first set of master latches, a first set of slave latches coupled to the first set of master latches, and a first address port. The second flip-flop latch array includes a second set of master latches, a second set of slave latches coupled to the second set of master latches, and a second address port. The register array includes an address counter, coupled to the first flip-flop latch array and the second flip-flop latch array. The address counter is shared by the first flip-flop latch array and the second flip-flop latch array and configured to address, in parallel in a test mode, the first flip-flop latch array through the first address port and the second flip-flop latch array through the second address port.

27 Claims, 6 Drawing Sheets

(56) References Cited

U.S. PATENT DOCUMENTS

| | | | |
|---|---|---|---|
| 2006/0253659 A1 | 11/2006 | Greenfield et al. | |
| 2010/0332929 A1* | 12/2010 | Branch | G01B 31/318536 714/731 |
| 2011/0002185 A1* | 1/2011 | Matsuno | G11C 11/406 365/222 |
| 2011/0234282 A1* | 9/2011 | Chopra | G01R 13/0272 327/199 |
| 2012/0146697 A1* | 6/2012 | Leach | H03K 3/012 327/202 |
| 2014/0040688 A1* | 2/2014 | Zhang | G01B 31/318541 714/727 |
| 2014/0042300 A1* | 2/2014 | Hsu | H04N 5/378 250/208.1 |

\* cited by examiner

APPARATUS FOR DESIGN FOR TESTABILITY OF MULTIPORT REGISTER ARRAYS

BACKGROUND

Field

The present disclosure relates generally to register arrays, and more particularly, to multiport register array testability.

Background

In general, processing systems employ registers to store data. The data may be stored in arrays of such registers, i.e., register arrays. The register arrays may include sets of registers in a master-slave configuration. A master-slave configuration of registers may include a first register, i.e., a "master" register and a second register, i.e., a "slave" register. A master-slave configuration may be created by connecting a first D latch and a second D latch in series. An enable input on the second latch may be the inverse of an enable input on the first latch. For example, an inverter may invert an enable signal. The enable signal may enable the first latch and the inverted enable signal may enable the second latch. Accordingly, an output of the second latch in the series (the slave) only changes in response to a change in an output of the first latch in the series (the master).

For a positive-edge triggered master-slave D flip-flop, when the clock signal is low, the "enable" at the master D latch may be high. This may allow the master latch to store an input value when the clock signal transitions from low to high. As the clock signal transitions high, the inverted "enable" of the master latch transitions low, and the value at the input to the master latch is held. Nearly simultaneously, an (inverted) enable connected to the slave D latch transitions from low to high with the clock signal. The transitions from low to high of the enable on the slave D latch allows the signal held at the rising edge of the clock by the master latch to pass through the slave latch. When the clock signal returns to low (1 to 0), the output of the slave latch is held, and the value at the last rising edge of the clock is held while the master latch accepts a new value in preparation for the next rising clock edge.

Current design for test (DFT) schemes for multiport register arrays using shared slave flip-flops do not support full scan dump. Lack of support for full scan dumps causes issues in debugging of functional failures in silicon. Counter based DFT schemes provides full scan dump support at the cost of large counter area overhead. The large counter area may take up a particularly high percentage of the device area for small sized latch based register files.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

As discussed above, DFT schemes for multiport register arrays using shared slave flip-flops do not support full scan dump, which causes issues in debugging of functional failures in silicon. Counter based DFT schemes provides full scan dump support at the cost of large counter area overhead. In an example, a counter may be shared among multiple instances of register files in order to amortize the area overhead. The example may be extended to any collection of any sized m×n register arrays with any number of write and read ports.

In an aspect of the disclosure, a method and an apparatus are provided. The apparatus may be a register array including a first flip-flop latch array. The first flip-flop latch array includes a first set of master latches, a first set of slave latches coupled to the first set of master latches, and a first address port configured to select a subset of the first set of slave latches to function with the first set of master latches. The first flip-flop latch array includes a second flip-flop latch array. The second flip-flop latch array includes a second set of master latches, a second set of slave latches coupled to the second set of master latches, and a second address port configured to select a subset of the second set of slave latches to function with the second set of master latches. The second address port is different than the first address port. The register array includes an address counter. The address counter is coupled to the first flip-flop latch array and the second flip-flop latch array. The address counter is shared by the first flip-flop latch array and the second flip-flop latch array. Additionally, the address counter is configured to address, in parallel in a test mode, the first flip-flop latch array through the first address port and the second flip-flop latch array through the second address port.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. Acronyms and other descriptive terminology may be used merely for convenience and clarity and are not intended to limit any concept disclosed herein.

Various memories presented throughout this disclosure may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of those elements. Rather, these designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Examples of other memories include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, all references to an SRAM are intended only to illustrate exemplary aspects of memory with the understanding that such aspects may be extended to a wide range of applications.

For small single read and write (1R1W) port latch arrays, a partial scan methodology may be used to provide comprehensive DFT test coverage without much area overhead. Unfortunately this methodology does not support full scan dumps. A $\log_2(M)$ bit counter is needed to support full scan dump functionality in an M×N latch based multiport register array, where $\log_2(M)$ may equal m bits, e.g., an 8 address latch array (M=8) may need a 3 bit counter (m=3). The counter area overhead may be significant, especially for smaller sized latch based multiport register arrays. Additionally, the partial scan methodology may become complex in terms of circuitry and fault analysis when adapted for register files with more than one read port and/or one write port (i.e., multiport register files).

An example register array may share a counter across multiple latch instances in order to amortize the counter area overhead. In one example, only one $\log_2(M)$ bit counter is needed to test any number of M×N register arrays. For a design with a collection of M×N arrays for various values of M and N, only one $\log_2(\max(M))$ bit counter is needed. The more arrays shared, the greater the area savings. Additionally, the solution can be extended to any number of port register files with some basic extra circuitry.

Figure 1:
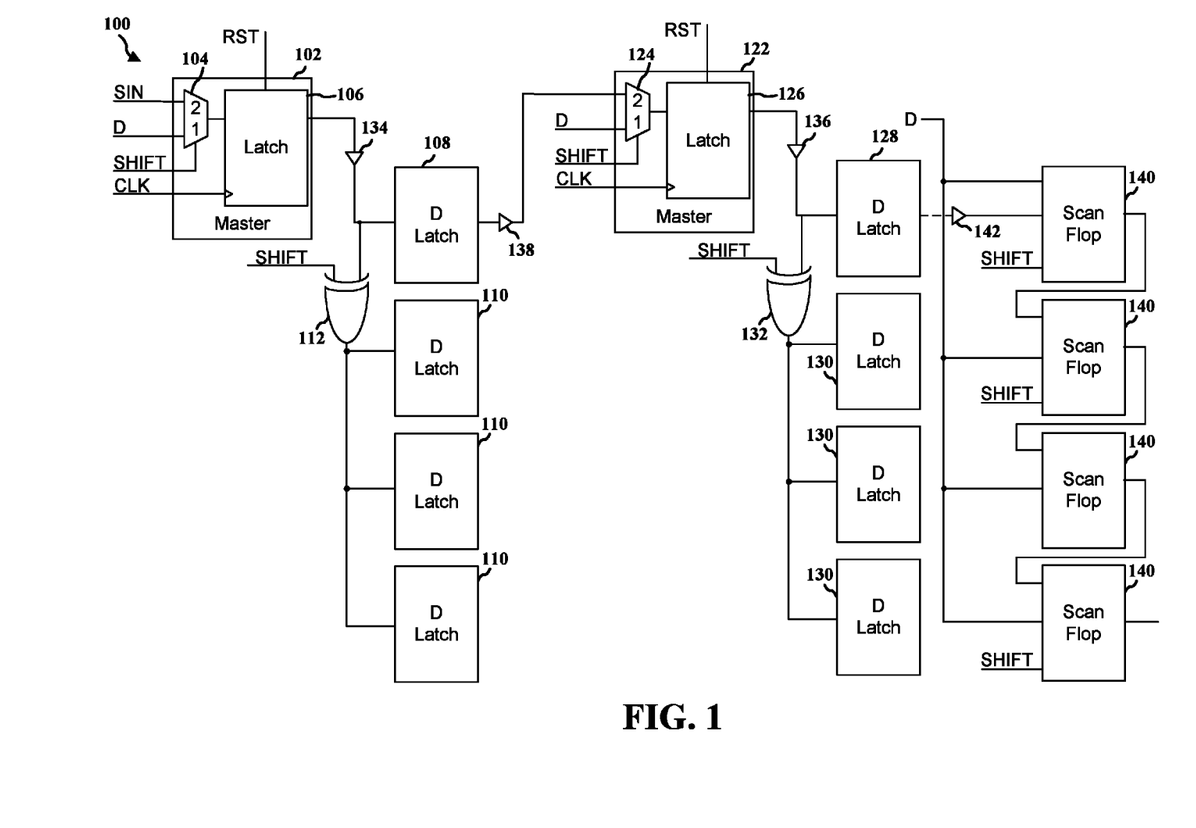
FIG. 1 is a diagram illustrating an example register array.

FIG. 1 is a diagram illustrating an example register array 100. The register array 100 can be configured as DFT array. In other words, the register array 100 may include features in the design that promote testability of the register array 100. The register array 100 includes a master latch 102. The master latch 102 may be capable of both scan input and data input functions. The scan input function allows test data to be "shifted" into the master latch 102 (and subsequently into other circuitry, such as other master latches and/or one or more slave latches) for testing. The scan input function may be used in a test mode to shift data into various latches or registers to test the register array 100, for example. The data input function allows data to be clocked into the master latch (and subsequently into other circuitry, such as other master latches and/or one or more slave latches). The data input function may be used in a functional mode, e.g., when the latch (and other circuitry) is operating functionally as opposed to in a test mode.

The scan input function and the data input function may be provided by a multiplexer 104. The multiplexer 104 may select between a scan input (SIN) signal and a data (D) input signal. The selection between the scan input signal and the data input signal may be made based on a selection input of the multiplexer 104 connected to a shift control signal ("shift"). For example, when the shift control signal is low, the data input signal may be selected. Conversely, when the shift control signal is high, the scan input data signal may be selected. The output of the multiplexer 104 is connected to a latch 106. The latch 106 provides the latching functionality of the master latch 102. Accordingly, depending on the state of the multiplexer 104, e.g., based on the state of the control line of the multiplexer (the shift control signal, "shift") one of the scan input signal or the data input signal may be input into the latch 106. For example, when the shift control signal is low, the data input signal may be input into the latch 106. Conversely, when the shift control signal is high, the scan input data signal may be input into the latch 106.

The latch 106 includes a clock input. The clock input to the latch 106 may be level sensitive. Accordingly, if the clock signal is high, the input to the latch 106 may allow data to pass to the output of the latch 106. Conversely, when the clock signal is low, the output of the latch 106 may be held to a value equal to the last value on the input of the latch 106 when the clock signal was high. The latch 106 also may include a reset input. When the reset signal is active, the latch 106 may be held reset. For example, when the latch 106 is reset (because the reset signal is high), the latch 106 output may be low regardless of the input and the state of the clock input when the reset signal is active.

The output of the latch 106 may be connected to one or more slave latches 108, 110. The slave latches 108, 110 may be D latches. (The latch 106 may also be a D latch.) The output of the latch 106 may be connected to the slave latch 108 through a buffer 134. Additionally, the output of the latch 106 may be connected to the slave latches 110 through the buffer 134 and an exclusive OR gate 112. The slave latch 108 may receive input data from the master latch 102 from both the data input and the scan input because the input to the slave latch 108 is connected to the output of the master latch 102 (the output of the latch 106) directly through the buffer 134, rather than through the exclusive OR gate 112. The exclusive OR gate 112 blocks the output of the master latch 102 when the shift control signal is high. Accordingly, the slave latches 110 do not receive scan input data from the master latch 102. Rather, in the example illustrated in FIG. 1, the slave latches 110 will only receive data from the data input to the master latch 102. Additionally, the data on the data input is only received when the shift control signal is low. (Depending on the timing of a change in the shift control signal relative to the clock, clk, it may be possible for the slave latches 110 to clock in individual bits of scan input data from the master latch 102 for an individual change to the shift control signal from low to high.)

The register array 100 may include a second master latch 122. An output of the slave latch 108 may be connected to a scan input to the second master latch 122, e.g., through a buffer 138. Accordingly, data may be shifted into the second master latch 122 from the output of the slave latch 108. The data input may also be connected to the second master latch 122. In some examples, the first master latch 102 and the second master latch 122 may be connected to a same bit on a same data bus. For example, FIG. 1 illustrates a data input of the first master latch 102 and a data input of the second master latch 122 connected to a same data input signal. In other examples, the first master latch 102 and the second master latch 122 may be connected to different bits. The different bits may be on a same data bus or on separate data buses.

In the example illustrated in FIG. 1, the second master latch 122 may be capable of both scan input and data input functions. The scan input function and the data input function may be provided by a multiplexer 124. The multiplexer 124 may select between a scan input signal and a data input signal based on a selection input connected to the shift control signal. For example, when the shift control signal is low, the data input signal may be selected. Conversely, when the shift control signal is high, the scan input signal may be selected. The output of the multiplexer 124 is connected to a latch 126. Accordingly, depending on the state of the multiplexer 124, e.g., based on the state of the control line of the multiplexer, one of the scan input signal or the data input signal may be input into the latch 126. For example, when the shift control signal is low, the data input signal may be input into the latch 126. Conversely, when the shift control signal is high, the scan input data signal may be input into the latch 126.

The latch 126 includes a clock input. The clock input to the latch 126 may be level sensitive. Accordingly, if the clock signal is high, the input to the latch 126 may allow data to pass to the output of the latch 126. Conversely, when the clock signal is low, the output of the latch 126 may be held to a value equal to the last value on the input of the latch 126 when the clock signal was high. The latch 126 also may include a reset input. When the reset signal is active, the latch 126 may be held reset. For example, when the latch 126 is reset (because the reset signal is high), the latch 126 output may be low regardless of the input and the state of the clock input when the reset signal is active.

The output of the latch 126 may be connected to one or more slave latches 128, 130. The slave latches 128, 130 may be D latches. (The latch 126 may also be a D latch.) For example, the output of the latch 126 may be connected to the slave latch 128 through a buffer 136. Additionally, the output of the latch 126 may be connected to the slave latches 130 through the buffer 136 and an exclusive OR gate 132. The slave latch 128 may receive input data from the master latch 122 from both the data input and the shift input because the input to the slave latch 128 is connected to the output of the master latch 122 (the output of the latch 126) directly through the buffer 136, rather than through the exclusive OR gate 132. The exclusive OR gate 132 blocks the output of the master latch 122 when the shift control signal is high. Accordingly, the slave latches 130 do not receive scan input data from the master latch 122. Rather, in the example illustrated in FIG. 1, the slave latches 130 will only receive data from the data input to the master latch 122. Additionally, the data on the data input is only received when the shift control signal is low. (Depending on the timing of a change in the shift control signal relative to the clock, clk, it may be possible for the slave latches 130 to clock in individual bits of scan input data from the master latch 102 for an individual change to the shift control signal from low to high.)

A series of scan flip-flops 140 may receive data from a data output of the slave latch 128, e.g., through a buffer 142. The scan flip-flops 140 may clock in data serially from flip-flop 140 to flip-flop 140 based on the state of the scan input control signal (shift). For example, when the scan input control signal is high, the scan flip-flops 140 may clock in data serially from flip-flop 140 to flip-flop 140. The scan flip-flops 140 clocking in data serially from flip-flop 140 to flip-flop 140 may be used to convert the data to parallel data. For example, clocking in data serially from flip-flop 140 to flip-flop 140 may be performed four times to generate 4 bit wide parallel data.

The register array 100 may have low area overhead, however, because not all slaves are on the scan chain, the scheme does not support a full scan dump. Additionally, with the complicated automatic test pattern generation (ATPG) model, creation/validation is difficult to extend to multiport register arrays. For example, using a counter for each latch array may also use a great deal of area on a die implementing the register array. Generally, the largest area overhead is counter because counters may include a large number of flip-flops and combinatorial logic. In an example that amortizes the counter across multiple register arrays, a savings of, for example, 17% area saving per register array may be achieved in some examples. Area saving may translate directly into power savings and cost saving. Generic solution which can provide area savings for any collection of sizes and read/write ports.

Figure 2:
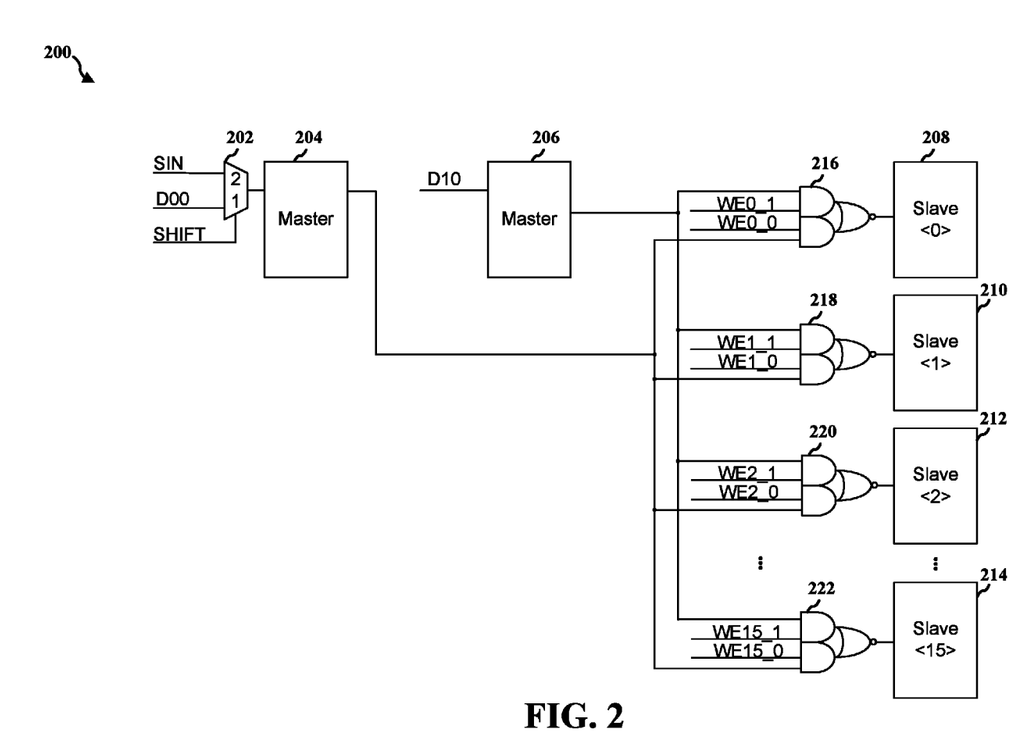
FIG. 2 is a diagram illustrating a multiport register array write example for an example in accordance with the systems and methods described herein.

FIG. 2 is a diagram illustrating a multiport register array write example for an example in accordance with the systems and methods described herein. The multiport register array 200 includes a master latch 204 and a master latch 206. The master latch 204 includes both data input and scan input functionality (also referred to as shift input functionality). The master latch 206 includes data input functionality. The master latch 206 does not include scan input functionality. In other examples, the master latch 206 may include the scan input functionality, however.

For the master latch 204, the data input and scan input functionality is provided by a multiplexer 202. The multiplexer 202 is controlled by the shift control signal (shift). When the shift control signal is low, the data input may be selected. When the shift control signal is high the scan input signal may be select. The output of the multiplexer 202 is connected to the input of the master latch 204. Accordingly the output of the multiplexer 202 may be input into the master latch 204.

An output of the master latch 204 is connected to a series of slave latches 208, 210, 212, 214, through a series of selection logic circuits 216, 218, 220, 222. The example of FIG. 2 may include 16 slave registers 0 to 15, however, slave latches 3 to 14 are omitted from the figure to simplify the diagram. Unlike the circuitry illustrated in FIG. 1, the master latch 204 is connected to multiple slave latches 208, 210, 212, 214 without a gating circuit, e.g., without the exclusive OR gates 112, 132 illustrated in FIG. 1, between the master latches 204, 206 and the multiple slave latches 208, 210, 212, 214. Accordingly, shift data may be shifted into each of the slave latches 208, 210, 212, 214, rather than only one, e.g., slave latch 108 of FIG. 1.

Various write enable signals may be used to controllably connect a particular master latch 204, 206 to a particular slave latch 208, 210, 212, 214. For example, the selection logic circuits 216, 218, 220, 222 may select which of the slave latches 208, 210, 212, 214 receive data, e.g., scan input data or data D00, D10 from the master latch 204 or the master latch 206, respectively, based on a series of write enable signals WE0_0, WE0_1, WE1_0, WE1_1, WE2_0, WE2_1, . . . , WE15_0, WE15_1. The example of FIG. 2 illustrates the use of 16 pairs of write enable signals to select from sixteen slave latches 208, 210, 212, 214, (with slave latches 3 to 14 not being illustrated). The sixteen slave latches 208, 210, 212, 214 may receive data from two master latches 204, 206. The master latch 206 provides an additional data path to the 16 slave latches 208, 210, 212, 214. In the illustrated example of FIG. 2, the second master latch 206 is not used for scan input functionality, however. While shift functionality may be added to the second master latch 206, adding circuitry for such shift functionality to the second master latch 206 would only provide access to one additional latch, i.e., the master latch 206. Data may already be shifted into each of the other latches illustrated in FIG. 2, i.e., master latch 204 and the 16 slave latches 208, 210, 212, 214. (Unlike the example of FIG. 1, the example of FIG. 2 allows the master latch 204 to shift data into any of the sixteen slave latches 208, 210, 212, 214.)

Figure 3:
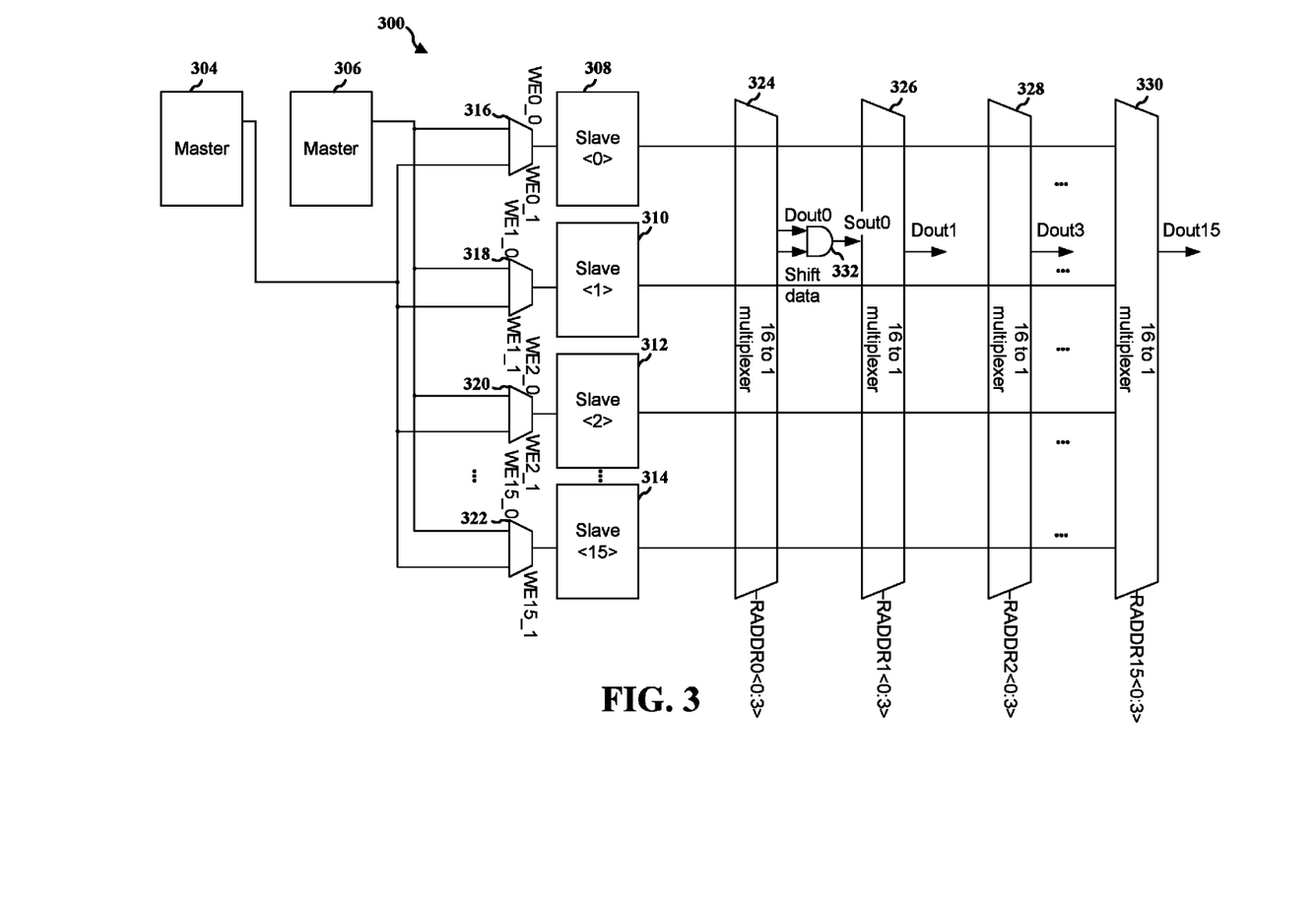
FIG. 3 is a diagram illustrating a multiport register array read configuration in accordance with the systems and methods described herein.

FIG. 3 is a diagram illustrating a multiport register array 300 read configuration in accordance with the systems and methods described herein. The example of FIG. 3 illustrates a multiport register array that is 16 bits wide. Multiplexers and slave latches for bits 3 through 14 are omitted to simplify the diagram. Additionally, some connections to the registers and multiplexers are omitted to simplify the diagram. For example, the multiport register array 300 includes a master latch 304 and a master latch 306. The input signals to the master latch 304 and the master latch 306, such as the data inputs, are omitted to simplify the diagram.

The multiport register array 300 includes a series of slave latches 308, 310, 312, 314. Each master latch 304, 306 is connected to the slave latches 308, 310, 312, 314 through a series of multiplexers 316, 318, 320, 322. The multiplexers 316, 318, 320, 322 may select which of the master latches 304, 306 write to which of the series of slave latches 308, 310, 312, 314 during a particular write cycle. For example, when the WE0_0 signal is active, the multiplexer 316 may select a data signal from the master latch 304 to write to the slave latch 308. When the WE0_1 signal is active, the multiplexer 316 may select a data signal from the master latch 306 to write to the slave latch 308. When the WE1_0 signal is active, the multiplexer 318 may select a data signal from the master latch 304 to write to the slave latch 310. When the WE1_1 signal is active, the multiplexer 318 may select a data signal from the master latch 306 to write to the slave latch 310. When the WE2_0 signal is active, the multiplexer 320 may select a data signal from the master latch 304 to write to the slave latch 312. When the WE2_1 signal is active, the multiplexer 320 may select a data signal from the master latch 306 to write to the slave latch 312. When the WE15_0 signal is active, the multiplexer 322 may select a data signal from the master latch 304 to write to the slave latch 314. When the WE15_1 signal is active, the multiplexer 322 may select a data signal from the master latch 306 to write to the slave latch 314. Generally, it may be assumed that two write enable signals on the same slave latches 308, 310, 312, 314, are not active at the same time. For example, generally, WE0_0 and WE0_1 are not active at the same time. Furthermore, generally a single master latch 304, 306 may access a single slave latch 308, 310, 312, 314 at a time. However, in some examples, multiple slave latches 308, 310, 312, 314 may be written with the same data from the same master latch 304, 306, at the same time.

The multiport register array 300 may include a series of sixteen 16-to-1 multiplexers 324, 326, 328, 330. Multiplexers for read addresses RADDR3 to RADDR14 are omitted to simplify the diagram. Each multiplexer 324, 326, 328, 330 (and those omitted from the diagram) may select one of the sixteen slave latches 308, 310, 312, 314 based on addressing bits. For example, the multiplexer 324 may use read address bits RADDR0<0..3>, the multiplexer 326 may use read address bits RADDR1<0..3>, the multiplexer 328 may use read address bits RADDR2<0..3>, and the multiplexer 330 may use read address bits RADDR15<0..3>.

One of the sixteen slave registers 308, 310, 312, 314 may be selected by the multiplexer depending on the value on the read address lines for the particular multiplexer. For example, a RADDR1<0:2> value of 111 binary may select slave<15>, i.e., slave latch 314. Accordingly, in the example, the binary value in the slave latch 314 may be output on Dout15 when the RADDR1<0:2> value is 111 binary.

Generally, data from a selected slave latch 308, 310, 312, 314 may be output on a data out line Dout0, Dout1, Dout2, . . . , Dout15, of the multiplexer 324, 326, 328, 330, respectively. As illustrated in FIG. 3, circuitry near the multiplexer 324 includes an AND gate 332 connected to a data out line, Dout0 from the multiplexer 324, and a shift data control signal "shift data." The AND gate 332 may allow shift data on the data out line Dout0 to be output on a shift out line Sout0. The data out signal Dout0 may be connected to other circuitry for conventional data reads, i.e., reads that do not involve the shift circuitry.

Figure 4:
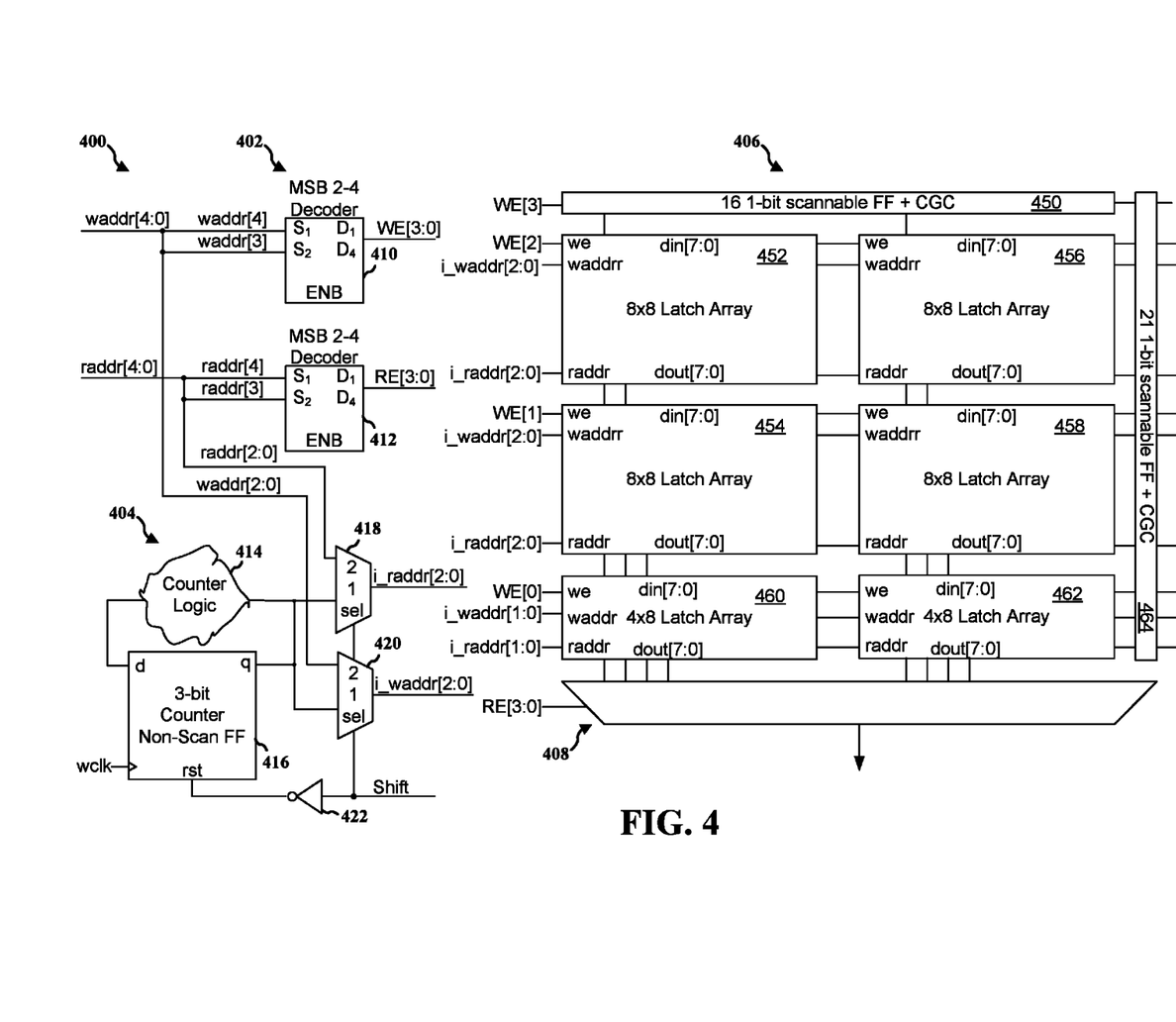
FIG. 4 is an example register array configuration including decoder circuitry, shared counter and multiplexer circuitry, and an array of latch arrays and flip-flops in accordance with the systems and methods described herein.

FIG. 4 is an example register array configuration 400 including decoder circuitry 402, shared counter and multiplexer circuitry 404 and an array 406 of latch arrays and flip-flops in accordance with the systems and methods described herein. The example of FIG. 4 illustrates the array 406 of latch arrays and flip-flops combined to form a 21×17 array 406. It will be understood that other array sizes may be selected.

The example of FIG. 4 generally illustrates the use of the register array configuration 400 in a functional mode. The functional mode may be a mode when the register array configuration 400 may be used as a functioning memory by a processor or other circuitry that may read and/or write the array 406. In contrast, the register array configuration 400 may also function in a test mode. In the test mode, data may be input using scan input circuitry and output using scan out circuitry. In the test mode, data may still be read and/or written to the array 406 by a processor or other circuitry, however, a scan path may be used to read and/or write to the array 406 (or a subset of the registers within the array 406).

The shared counter and multiplexer circuitry 404 of the illustrated example of FIG. 4 includes counter logic 414, a 3-bit address counter 416, a pair of multiplexers 418, 420, and an inverter 422. The counter logic 414 may control the functionality of the address counter 416. The address counter 416 may count out a series of addresses, e.g., read address, i_raddr[2:0] and/or write address, i_waddr[2:0]. The multiplexers 418, 420 may be used to select between address lines that may be used in a functional mode, and outputs of the address counter 416, that may be used for addressing in a test mode.

The decoder circuitry 402 includes a write decoder 410 and a read decoder 412. The write decoder 410 decodes a series of write address bits, e.g., waddr[4:3] into a series of write enable bits WE[3:0]. The write enable bits may be used to enable one or more latch arrays in the array 406. The read decoder 412 decodes a series of read address bits RADDR [4:3] into a series of read enable bits RE[3:0]. The read enable bits may be used to select an output to be read. For example, outputs of the array 406 may be selected using the multiplexer 408. The read enable bits may control the multiplexer 408 to select which outputs of the array 406 are output to the data out, Dout[16:0], of the multiplexer 408.

The array 406 of latch arrays and flip-flops illustrated in FIG. 4 includes four 8×8 latch arrays 452, 454, 456, 458, two 4×8 latch arrays 460, 462, a 16×1-bit scannable flip-flop 450, and a 21×1-bit scannable flip-flop 464. As described above, the four 8×8 latch arrays 452, 454, 456, 458, the two 4×8 latch arrays 460, 462, the 16×1-bit scannable flip-flop 450, and the 21×1-bit scannable flip-flop 464 are arranged to form a 21×17 register array.

The 16×1-bit scannable flip-flop 450 may include a series of 16 master latches and 16 slave latches with one master latch connected to each slave latch. Because the 16×1-bit scalable flip-flop 450 is only one bit wide, the 16×1-bit scalable flip-flop 450 generally does not exploit the master latch sharing described with respect to other arrays of latches described herein. Accordingly, the 16×1-bit scannable flip-flop 450 may include 16 master latches, each one connected to one of 16 slave latches. Similarly, the 21×1-bit scannable flip-flop 464 may include a series of 21 master latches and 21 slave latches with one master latch connected to each slave latch. Because the 21×1-bit scalable flip-flop 464 is only one bit deep, the 21×1-bit scalable flip-flop 464 also generally does not exploit the master latch sharing described with respect to various other arrays of latches described herein.

Each of the 8×8 latch arrays may include eight sets of one or more master latches that may each be connected to eight slave latches. For example, each of the 8×8 latch arrays may use a set of eight structures similar to the structures illustrated in FIG. 2 and FIG. 3. However, the number of slave latches may be reduced from 16 slave latches, as it is in FIG. 2 and FIG. 3, to eight slave latches, as it is in the example of the 8×8 latch arrays used in FIG. 4. (An 8×8 latch array would have at least eight master latches, 16 master latches if two are used for each set of the 8 slave latches, and 64 slave latches.) Similarly, each of the 4×8 latch arrays 460, 426 may include four sets of one or more master latches that may each be connected to eight slave latches. For example, each of the 4×8 latch arrays 460, 426 may use a set of four structures similar to the structures illustrated in FIG. 3 and FIG. 4. However, the number of slave latches may be reduced from 16 to 8 in the example of the 4×8 latch arrays 460, 426 used in FIG. 4. (A 4×8 latch array would have at least 4 master latches, 8 master latches if two are used for each set of the 8 slave latches, and 64 slave latches total.)

When the register array configuration 400 of FIG. 4 is operating in a functional mode, writes may be performed using the write addresses, WADDR[4:0]. The most significant bits of the write address may be decoded using a 2 to 4 decoder 410 to generate the write enable bits, WE[3:0]. The least significant bits of the write address may be used to address the latches within the latch arrays. For example, the least significant three bits of the write address (e.g., i_waddr [2:0]) may be used to select between the eight sets of 8 latches in each 8×8 latch array ($2^3$=8). Similarly, the least significant two bits of the write address (e.g., i_waddr[1:0]) may be used to select between the four sets of eight latches in the 4×8 latch array ($2^2$=4). (Accordingly, the counter will count through the addresses for the 4×8 latch array twice as it counts through the addresses for the 8×8 latch array once.)

When the register array configuration 400 of FIG. 4 is operating in the functional mode, reads may be performed using the read addresses, RADDR[4:0]. For example, the most significant bits of the read address may be decoded using a 2 to 4 read decoder 412 to generate the read enable bits, RE[3:0]. The read enable bits, RE[3:0], may be used to perform a selection at the multiplexer 408. The least significant bits of the read address may be used to address the latches within the latch arrays of the array 406. For example, the least significant three bits of the read address (e.g., i_raddr[2:0]) may be used to select between the 8 sets of 8 latches in each 8×8 latch array ($2^3$=8). Similarly, the least significant two bits of the read address (i_raddr[1:0]) may be used to select between the four sets of eight latches in the 4×8 latch array ($2^2$=4).

When the register array configuration 400 of FIG. 4 is operating in the functional mode, the shift control signal may be low. Accordingly, the inverter 422 may invert the shift control signal, which is low, to produce a high signal. A high signal on the rst (reset) input to the 3-bit address counter 416 may reset the 3-bit address counter 416 and may hold the 3-bit address counter 416 reset. In other words, as long as the shift control signal is low, the 3-bit address counter 416 may be held reset.

As described above, FIG. 4 illustrates an example of a generic 21×17 configuration that includes 4×8 and 8×8 registers, in a functional mode. In the functional mode, only one row will be written and/or read out per clock cycle. The MSB decoder, e.g., decoder 410, 412 may determine which row of a register array is selected. An LSB decoder may be implemented inside the array 406 and may determine which row of entries to write or to read from inside the selected register arrays.

Using the master latch/slave latch architecture described with respect to FIGS. 2-3, the 8×8 latch arrays and the 4×8 latch arrays 460, 426 of FIG. 4 (or other size latch arrays) may be configured such that multiple slave latches may each be provided with scan data and be read using scan functionality.

Figure 5:
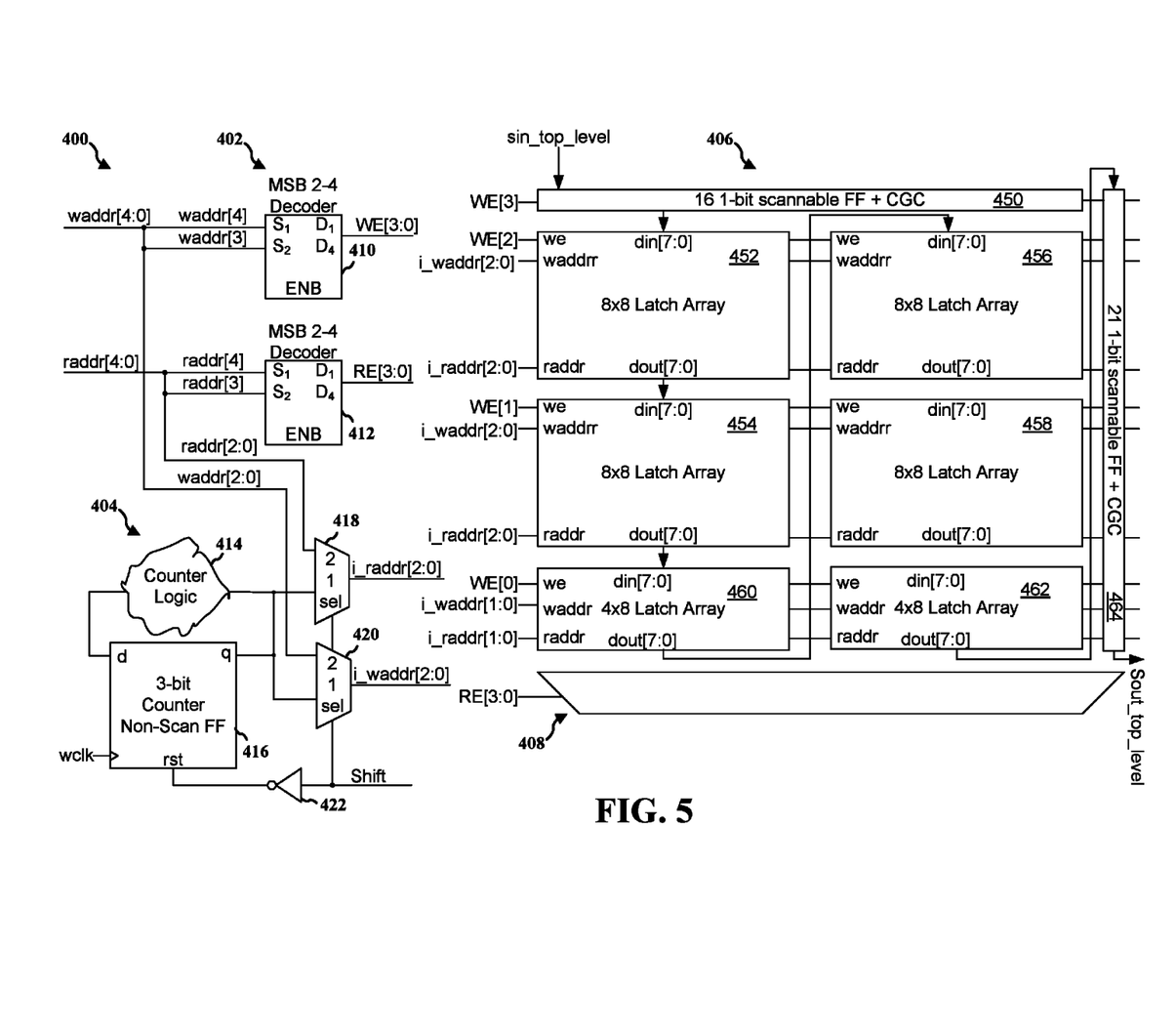
FIG. 5 illustrates the example register array configuration of FIG. 4 used in a test mode.

FIG. 5 illustrates the example register array configuration 400 of FIG. 4 used in a test mode. In the test mode, addressing of the array 406 may be controlled using the shared counter and multiplexer circuitry 404. The shared counter and multiplexer circuitry 404 may include the counter logic 414, the 3-bit address counter 416, the multiplexers 418, 420, and the inverter 422.

The multiplexer 418 may select the output of the 3-bit address counter 416 so that the counter may count through a series of address values as a series of address locations used for reads. Similarly, the multiplexer 420 may select the output of the 3-bit address counter 416 so that the counter may count through a series of address values as a series of address locations used for writes.

The inverter 422 may invert the shift control signal to generate a low input to the reset signal on the 3-bit address counter 416. When the reset signal on the 3-bit address counter 416 is low, the 3-bit address counter may count 3-bit values. The 3-bit values may be used to address registers within the array 406 for reads and writes using one of the multiplexers 418, 420. A counter logic 414 may be used to control an input to the address counter 416. Accordingly, the counter logic 414 may be used to control the count sequence of the address counter 416.

The address counter 416 may count various 3-bit values based on a clock input, wclk, and the data input to the 3-bit address counter 416. Generally, the 3-bit values may proceed numerically from 000 binary to 111 binary. However, the counts may be interrupted by a reset. For example, when shift is low, the counter may be reset back to 000 binary from any count value that the 3-bit address counter has reached. Furthermore, the counter logic 414 may vary the order of the 3-bit values counted. Accordingly, the addresses may be addressed in other orders, other than in an increasing or decreasing numeric order. Additionally, the counter logic 414 may eliminate some 3-bit count value. Accordingly, the addresses in the array 406 may be accessed during the shift procedures when in a test mode in various orders and various addresses may be skipped depending on the design of the counter logic 414. (Skipped addresses may or may not correspond to an actual flip-flop, latch, pair of latches, master/slave pair, or other storage combination.)

When the test mode is used, scan input values may be clock into the array 406 using the address counter 416 to address the memory locations. In a test mode, the memory locations are not scanned individually. Rather, in the example of FIG. 5, the 3-bit address counter 416 counts through each of the 8 deep, 8-bit registers of the 8×8 latch arrays in parallel. The four deep, 8-bit registers of the 4×8 latch array use the two least significant bits of the 3-bit address counter 416. Accordingly, each of the four deep 8-bit registers in the 4×8 latch array will be addressed twice for every time the eight deep 8-bit registers in an 8×8 latch arrays are addressed.

FIG. 5 illustrates a scan input example. Data may be scanned into the array 406 using a sin_top_input to the 16 one bit scalable flip-flop. Scan input data from the 16 one bit scalable flip-flop may be clocked into the top left 8×8 latch array 452. The scan input data may be clocked through the top-left 8×8 latch array and into the bottom left 8×8 latch array 454 as indicated by the arrow between the top left 8×8 latch array 452 and the bottom left 8×8 latch array 454. The scan input data may be clocked through the bottom left 8×8 latch array 454 and into the left 4×8 latch array 460 as indicated by the arrow between the bottom left 8×8 latch array 454 and the left 4×8 latch array 460. The scan input data may be clocked through the bottom of the left 4×8 latch array 460 to the top right 8×8 latch array 456 as indicated by the arrow from the scan output of the left 4×8 latch array 460 to the scan input of the top right 8×8 latch array 456. Scan input data may be scanned through the top right 8×8 latch array 456 into the bottom right 8×8 latch array 458 as indicated by the arrow from the scan out output of the top right 8×8 latch array 456 and the scan input of the bottom right 8×8 latch array 458. Scan input data may be scanned through the bottom right 8×8 latch array 458 into the right 4×8 latch array 462 as indicated by the arrow between the bottom right 8×8 latch array 458 and the right 4×8 latch array 462. Data from the right 4×8 latch array 462 may be clocked into the 21 one bit scannable flip-flop and through the 21 scannable flip-flop one bit to the Scan_out_top_level signal.

As described above, FIG. 5 illustrates an example of a generic 21×17 configuration that includes 4×8 and 8×8 registers in a test mode. In the test mode, the counter will activate and write to one row in all register arrays every cycle. The maximum depth is eight for the 8×8 register file (M=8). Log 2(max(M))=3, accordingly, a 3-bit address counter is needed. A 4×8 register arrays may use the lower 2 bits of the 3-bit address counter. Scan chain bits may all be stitched together during DFT insertion in any order and in any number of chains. In shift mode, the counter may start counting from 0 to 7 (000 binary to 111 binary) and write all entries in the array 406. In the capture mode, the counter may start over, counting from 0 to 7. Data may be read out. Every 8 cycles there will be a match.

The systems and methods described herein relate to register arrays. One example register array may include a first flip-flop latch array (450, 452, 454, 456, 458, 460, 462, 454). The first flip-flop latch array (450, 452, 454, 456, 458, 460, 462, 454) includes a first set of master latches (sets of latches 204, 206, 304, 306) and a first set of slave latches (208, 210, 212, 214, 308, 310, 312, 314) coupled to the first set of master latches, and a first address port configured to select a subset of the first set of slave latches to function with the first set of master latches.

The example register array may include a second flip-flop latch array (450, 452, 454, 456, 458, 460, 462, 454). The second flip-flop latch array (450, 452, 454, 456, 458, 460, 462, 454) may include a second set of master latches (204, 206, 304, 306) and a second set of slave latches (208, 210, 212, 214, 308, 310, 312, 314) coupled to the second set of master latches, and a second address port configured to select a subset of the second set of slave latches to function with the second set of master latches. The second address port is different than the first address port (WE[0], WE[1], WE[2], WE[3]).

The example register array may include an address counter 416 coupled to the first flip-flop latch array (within 406) and the second flip-flop latch array (within 406). The address counter 416 may be shared by the first flip-flop latch array (within 406) and the second flip-flop latch array (within 406) and configured to address, in parallel in a test mode, the first flip-flop latch array through the first address port and the second flip-flop latch array through the second address port. (For example, the top left 8×8 latch array 452 may be addressed by an address port connected to WE[2] and the bottom left 8×8 latch array 454 may be addressed by an address port connected to WE[1].)

In an example, the first flip-flop latch array (452, 454, 456, 458) is a first size (e.g., 8×8) having a depth N (e.g., the first 8) and the second flip-flop latch array (460, 462) is a second size (e.g., 4×8) having a depth M (e.g., 4). In an example, the first size and the second size are not equal.

In an example, the first address port is configured to receive n address bits and the second address port is configured to receive m address bits, and wherein m≠n. In an example, n=$\log_2(N)$ and m=$\log_2(M)$. The address counter may be an n-bit counter and wherein n>m. The n bits (e.g., 3 bits) of the counter may be coupled to the first flip-flop latch array (e.g., one of the 8×8 latch arrays) and m least significant bits (e.g., 2 least significant bits) of the counter are coupled to the second flip-flop latch array (e.g., one of the 4×8 latch arrays). The register array may further include a plurality of 1-bit flip-flops (e.g., 16 1-bit scannable flip-flop 450, 21 1-bit scannable flip-flop 454).

In an example, a register array may further include a write decoder 410 and a read decoder 612. The write decoder 410 may be configured to write enable the first flip-flop latch array (452, 454, 456, 458) and the second flip-flop latch array (460, 462). The read decoder 612 may be configured to read enable the first flip-flop latch array (452, 454, 456, 458) and the second flip-flop latch array (460, 462).

In an example, the first address port includes a first write address port and a first read address port. The second address port may include a second write address port and a second read address port.

As described above, the register array 100 of FIG. 1 provides an area savings by sharing a master latch 102 with a series of slave latches 108, 110. The slave latches 110 are not writeable using a scan input feature. The multiport register arrays illustrated in FIGS. 2 and 3 also provide an area savings by sharing a master latch 204, 206, 304, 306 with a series of slave latches 208, 210, 212, 214, 308, 310, 312, 314, however, the multiport register arrays illustrated in FIGS. 2 and 3 also provide the scan in feature to the slave latches 208, 210, 212, 214, 308, 310, 312, 314. Addressing during testing using a scan in feature may use a series of counters. The counters may take up a great deal of area. Accordingly, a counter may be shared across multiple sets of registers, as illustrated in FIGS. 4 and 5.

In an example, a first set of slave latches are addressed for a read using at least one multiplexer (324, 326, 328, 330). An output (Dout0) of at least one (324) of the at least one multiplexer (324, 326, 328, 330) may be coupled to a first input to an AND gate 332. A second input to the AND gate 332 may be coupled to a shift data signal (Shift data). An output of the AND gate 332 may be coupled to a shift out data signal (Sout0).

Figure 6:
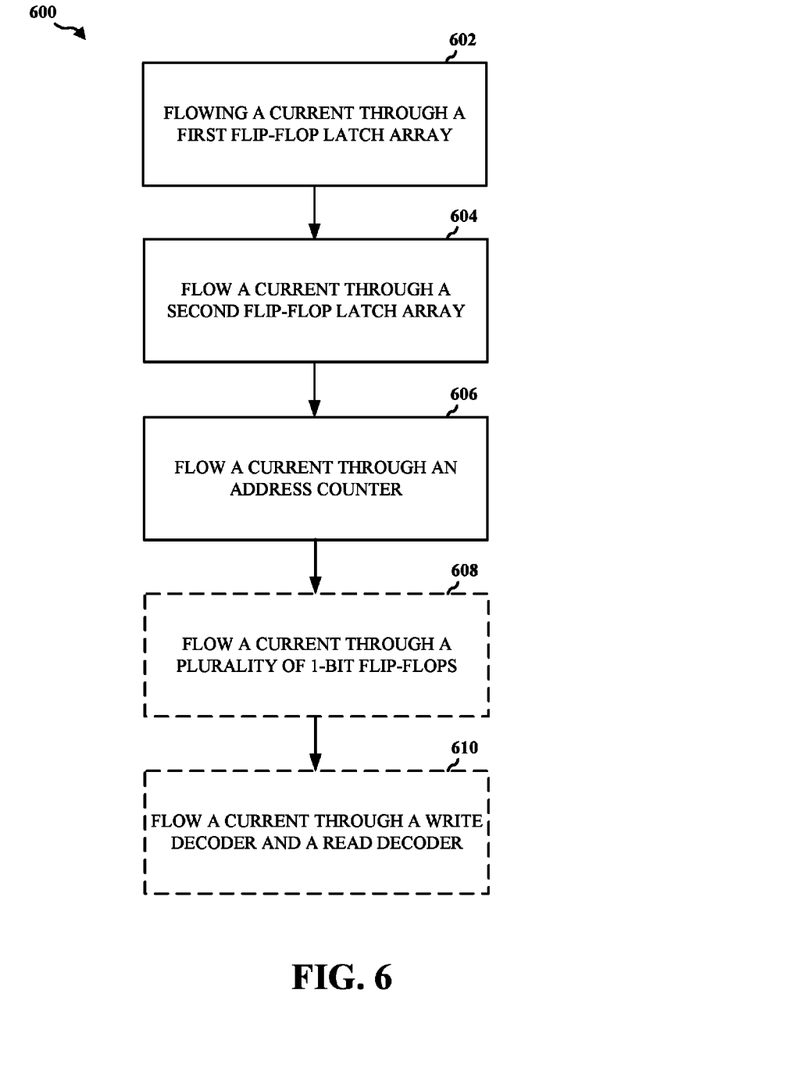
FIG. 6 is a flowchart of one example of a method related to multiport register arrays in accordance with the systems and methods described herein.

FIG. 6 is a flowchart 600 of one example of a method related to multiport register arrays in accordance with the systems and methods described herein. Block 602 illustrates operating a first flip-flop latch array (450, 452, 454, 456, 458, 460, 462, 454). The first flip-flop latch array includes a first set of master latches (204, 206, 304, 306) and a first set of slave latches (208, 210, 212, 214, 308, 310, 312, 314) coupled to the first set of master latches, and a first address port (WE[0], WE[1], WE[2], WE[3]) configured to select a subset of the first set of slave latches to function with the first set of master latches.

Block 604 illustrates operating a second flip-flop latch array (450, 452, 454, 456, 458, 460, 462, 454). The second flip-flop latch array may include a second set of master latches (204, 206, 304, 306) and a second set of slave latches (208, 210, 212, 214, 308, 310, 312, 314) coupled to the second set of master latches, and a second address port (WE[0], WE[1], WE[2], WE[3]) configured to select a subset of the second set of slave latches to function with the second set of master latches. The second address port is different than the first address port (e.g., the ports connected to the following signals: WE[0] and WE[1], WE[0] and WE[2], WE[0] and WE[3], WE[1] and WE[0], WE[1] and WE[2], WE[1] and WE[3], WE[2] and WE[0], ..., WE[3] and WE[2]).

Block 606 illustrates operating an address counter 416. The address counter 416 may be coupled to the first flip-flop latch array and the second flip-flop latch array (individual arrays within the array 406). Additionally, the address counter 416 may be shared by the first flip-flop latch array (within 406) and the second flip-flop latch array (within 406) and configured to address, in parallel in a test mode, the first flip-flop latch array through the first address port and the second flip-flop latch array through the second address port. (For example, the top left 8×8 latch array 452 may be addressed by WE[2] and the bottom left 8×8 latch array 454 may be addressed by WE[1].)

Block 608 illustrates optionally operating a plurality of 1-bit flip-flops concurrently during a test mode. The 1-bit flip-flops may include the 16 1-bit scannable flip-flop 450 and/or the 21 1-bit scannable flip-flop 454 illustrated in the example of FIGS. 4 and 5. It will be understood that other size arrays and flip-flops may be used in other examples. Additionally, the plurality of 1-bit flip-flops may each include a master latch and a slave latch. The plurality of flip-flops may be addressable from at least one of the read decoder and the write decoder.

Block 610 illustrates optionally operating a write decoder 410 and a read decoder 412. The write decoder 410 may be configured to write enable the first flip-flop latch array and the second flip-flop latch array. The read decoder 412 may be configured to read enable the first flip-flop latch array and the second flip-flop latch array.

An example register array includes means for operating a first flip-flop latch array. The first flip-flop latch array includes a first set of master latches, a first set of slave latches coupled to the first set of master latches, and a first address port configured to select a subset of the first set of slave latches to function with the first set of master latches. The example register array includes means for operating a second flip-flop latch array. The second flip-flop latch array includes a second set of master latches, a second set of slave latches coupled to the second set of master latches, and a second address port configured to select a subset of the second set of slave latches to function with the second set of master latches. The second address port is different than the first address port. The example register array includes means for operating an address counter. The address counter is coupled to the first flip-flop latch array and the second flip-flop latch array. The address counter is shared by the first flip-flop latch array and the second flip-flop latch array and configured to address, in parallel in a test mode, the first flip-flop latch array through the first address port and the second flip-flop latch array through the second address port.

An example register array may include means for operating a plurality of 1-bit flip-flops 450, 454 concurrently during a test mode. Additionally, the plurality of 1-bit flip-flops 450, 454 may each include a master latch and a slave latch. The plurality of flip-flops 450, 454 may be addressable from at least one of the read decoder and the write decoder.

An example register array may include means for operating a write decoder and a read decoder, the write decoder configured to write enable the first flip-flop latch array and the second flip-flop latch array in a functional mode, the read decoder configured to read enable the first flip-flop latch array and the second flip-flop latch array.

These means may include one or more of the circuits illustrated in FIGS. 2-5, such as the master latches 204, 206, 304, 306, slave latches 208, 210, 212, 214, 308, 310, 312, 314, multiplexers 202, 316, 318, 320, 322, 324, 326, 328, 330, 408, 418, 420, logic circuits 216, 218, 220, 222, AND gate 332, counter logic 414, counter 416, decoder 410, 412, array 406, for example.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." No claim element is to be construed under the provisions of 35 U.S.C. § 112(f) unless the element is expressly recited using the phrase "means for" or, in the case of a method claim, the element is recited using the phrase "step for."

What is claimed is:

1. A register array comprising:
a first flip-flop latch array including:
a first set of master latches;
a first set of slave latches coupled to the first set of master latches; and
a first address port configured to select a subset of the first set of slave latches to function with the first set of master latches;
a second flip-flop latch array including:
a second set of master latches;
a second set of slave latches coupled to the second set of master latches; and
a second address port configured to select a subset of the second set of slave latches to function with the second set of master latches, the second address port being different than the first address port; and
an address counter, coupled to the first flip-flop latch array and the second flip-flop latch array, the address counter shared by the first flip-flop latch array and the second flip-flop latch array and configurable to address, in parallel in a test mode, the first flip-flop latch array through the first address port and the second flip-flop latch array through the second address port.

2. The register array of claim 1, further comprising a write decoder and a read decoder, the write decoder configured to write enable the first flip-flop latch array and the second flip-flop latch array in a functional mode, the read decoder configured to read enable the first flip-flop latch array and the second flip-flop latch array in the functional mode.

3. The register array of claim 2, further comprising a plurality of 1-bit flip-flops, the plurality of 1-bit flip-flops each comprising a master latch and a slave latch, the plurality of flip-flops addressable from at least one of the read decoder and the write decoder.

4. The register array of claim 1, wherein the first address port includes a first write address port and a first read address port, and the second address port includes a second write address port and a second read address port.

5. The register array of claim 1, wherein the first flip-flop latch array is a first size having a depth N and the second flip-flop latch array is a second size having a depth M, and wherein the first size and the second size are not equal.

6. The register array of claim 5, wherein the first address port is configured to receive n address bits and the second address port is configured to receive m address bits, wherein m≠n and wherein n=$\log_2(N)$ and m=$\log_2(M)$.

7. The register array of claim 6, wherein the address counter comprises an n-bit counter and wherein n>m.

8. The register array of claim 7, wherein n bits of the counter are coupled to the first flip-flop latch array and m least significant bits of the counter are coupled to the second flip-flop latch array.

9. The register array of claim 1, wherein the first set of slave latches are addressed for a read using at least one multiplexer and wherein an output of at least one of the at least one multiplexer is coupled to a first input to an AND gate, a second input to the AND gate coupled to a shift data signal, and an output of the AND gate coupled to a shift out data signal.

10. A method comprising:
operating a first flip-flop latch array, the first flip-flop latch array including:
a first set of master latches;
a first set of slave latches coupled to the first set of master latches; and
a first address port configured to select a subset of the first set of slave latches to function with the first set of master latches;
operating a second flip-flop latch array, the second flip-flop latch array including:
a second set of master latches;
a second set of slave latches coupled to the second set of master latches; and
a second address port configured to select a subset of the second set of slave latches to function with the second set of master latches, the second address port being different than the first address port; and operating an address counter, the address counter coupled to the first flip-flop latch array and the second flip-flop latch array, the address counter shared by the first flip-flop latch array and the second flip-flop latch array and configured to address, in parallel in a test mode, the first flip-flop latch array through the first address port and the second flip-flop latch array through the second address port.

11. The method of claim 10, further comprising operating a write decoder and a read decoder, the write decoder configured to write enable the first flip-flop latch array and the second flip-flop latch array in a functional mode, the read decoder configured to read enable the first flip-flop latch array and the second flip-flop latch array in the functional mode.

12. The method of claim 11, further comprising operating a plurality of 1-bit flip-flops concurrently during the test mode, the plurality of 1-bit flip-flops each comprising a master latch and a slave latch, the plurality of flip-flops addressable from at least one of the read decoder and the write decoder.

13. The method of claim 10, wherein the first address port includes a first write address port and a first read address port, and the second address port includes a second write address port and a second read address port.

14. The method of claim 10, wherein the first flip-flop latch array is a first size and the second flip-flop latch array is a second size, and wherein the first size and the second size are not equal.

15. The method of claim 14, wherein the first address port is configured to receive n address bits and the second address port is configured to receive m address bits, and wherein m≠n.

16. The method of claim 15, wherein the address counter comprises an n-bit counter and wherein n>m.

17. The method of claim 16, wherein n bits of the counter are coupled to the first flip-flop latch array and m least significant bits of the counter are coupled to the second flip-flop latch array.

18. The method of claim 10, wherein the first set of slave latches are addressed for a read using at least one multiplexer and wherein an output of at least one of the at least one multiplexer is coupled to a first input to an AND gate, a second input to the AND gate coupled to a shift data signal, and an output of the AND gate coupled to a shift out data signal.

19. A register array comprising:
means for operating a first flip-flop latch array, the first flip-flop latch array including:
a first set of master latches;
a first set of slave latches coupled to the first set of master latches; and
a first address port configured to select a subset of the first set of slave latches to function with the first set of master latches;

means for operating a second flip-flop latch array, the second flip-flop latch array including:
a second set of master latches;
a second set of slave latches coupled to the second set of master latches; and
a second address port configured to select a subset of the second set of slave latches to function with the second set of master latches, the second address port being different than the first address port; and means for operating an address counter, the address counter coupled to the first flip-flop latch array and the second flip-flop latch array, the address counter shared by the first flip-flop latch array and the second flip-flop latch array and configured to address, in parallel in a test mode, the first flip-flop latch array through the first address port and the second flip-flop latch array through the second address port.

20. The register array of claim 19, further comprising means for operating a write decoder and a read decoder, the write decoder configured to write enable the first flip-flop latch array and the second flip-flop latch array in a functional mode, the read decoder configured to read enable the first flip-flop latch array and the second flip-flop latch array in the functional mode.

21. The register array of claim 20, further comprising means for operating a plurality of 1-bit flip-flops concurrently during the test mode, the plurality of 1-bit flip-flops each comprising a master latch and a slave latch, the plurality of flip-flops addressable from at least one of the read decoder and the write decoder.

22. The register array of claim 19, wherein the first address port includes a first write address port and a first read address port, and the second address port includes a second write address port and a second read address port.

23. The register array of claim 19, wherein the first flip-flop latch array is a first size and the second flip-flop latch array is a second size, and wherein the first size and the second size are not equal.

24. The register array of claim 23, wherein the first address port is configured to receive n address bits and the second address port is configured to receive m address bits, and wherein m≠n.

25. The register array of claim 24, wherein the address counter comprises an n-bit counter and wherein n>m.

26. The register array of claim 25, wherein n bits of the counter are coupled to the first flip-flop latch array and m least significant bits of the counter are coupled to the second flip-flop latch array.

27. The register array of claim 19, wherein the first set of slave latches are addressed for a read using at least one multiplexer and wherein an output of at least one of the at least one multiplexer is coupled to a first input to an AND gate, a second input to the AND gate coupled to a shift data signal, and an output of the AND gate coupled to a shift out data signal.

* * * * *